(12) United States Patent
Corcelli

(10) Patent No.: US 7,646,645 B2
(45) Date of Patent: Jan. 12, 2010

(54) METHOD AND APPARATUS FOR TESTING THE FUNCTIONALITY OF A PAGE DECODER

(75) Inventor: Ciro Corcelli, Trondheim (NO)

(73) Assignee: Atmel Corporation, San Jose, CA (US)

( * ) Notice: Subject to any disclaimer, the term of this patent is extended or adjusted under 35 U.S.C. 154(b) by 155 days.

(21) Appl. No.: 11/735,182

(22) Filed: Apr. 13, 2007

(65) Prior Publication Data

US 2008/0253207 A1    Oct. 16, 2008

(51) Int. Cl.
*G11C 16/06* (2006.01)
(52) U.S. Cl. ................... 365/185.23; 365/185.22; 365/185.12; 365/185.33
(58) Field of Classification Search ............ 365/185.23, 365/185.12, 185.33, 185.18, 185.29, 201, 365/185.22
See application file for complete search history.

(56) References Cited

U.S. PATENT DOCUMENTS 4,672,610 A    6/1987    Salick (Continued)

FOREIGN PATENT DOCUMENTS

WO    WO-2008/127616    10/2008

OTHER PUBLICATIONS

"International Application Serial No. PCT/US2008/004637, Search Report mailed Jul. 30, 2008".

(Continued)

*Primary Examiner*—David Lam
(74) *Attorney, Agent, or Firm*—Schwegman, Lundberg & Woessner, P.A.

(57) ABSTRACT

A method and apparatus for testing correct operation of a page decoder in a memory is provided. In one implementation, the method includes erasing the memory to reset all memory cells associated with each of the N pages in the memory, and iteratively generating a unique bit sequence of M bits and programming the unique bit sequence into a plurality of the N pages at a given time until each of the N pages contains a unique bit sequence relative to other pages in the memory. Responsive to each of the N pages having a unique bit sequence, the method further includes using the page decoder to read out each unique bit sequence associated with the N pages to verify correct operation of the page decoder.

12 Claims, 5 Drawing Sheets

U.S. PATENT DOCUMENTS

| | | | |
|---|---|---|---|
| 5,623,620 | A | 4/1997 | Fandrich et al. |
| 5,954,831 | A | 9/1999 | Chang |
| 6,212,112 | B1 | 4/2001 | Naura et al. |
| 6,510,090 | B1 | 1/2003 | Chida |
| 6,643,180 | B2 | 11/2003 | Ikehashi et al. |
| 6,785,162 | B2 | 8/2004 | Naso et al. |
| 6,865,702 | B2 | 3/2005 | Roohparvar |
| 6,977,410 | B2 | 12/2005 | Naso et al. |
| 7,009,878 | B2 * | 3/2006 | Hosono et al. ......... 365/185.03 |
| 7,054,209 | B2 | 5/2006 | Kawai et al. |
| 7,093,173 | B2 | 8/2006 | Roohparvar |
| 7,102,927 | B2 * | 9/2006 | Jo ......................... 365/185.12 |
| 7,170,791 | B2 * | 1/2007 | Iwase et al. ............ 365/185.22 |
| 7,307,864 | B2 * | 12/2007 | Kohara ....................... 365/96 |
| 7,366,033 | B2 * | 4/2008 | Park et al. ............. 365/189.05 |
| 7,382,656 | B2 * | 6/2008 | Ho et al. ................ 365/185.22 |
| 2004/0015756 | A1 | 1/2004 | Chiu et al. |
| 2005/0018490 | A1 | 1/2005 | Leconte et al. |
| 2006/0123280 | A1 | 6/2006 | Tran et al. |

OTHER PUBLICATIONS

"International Application Serial No. PCT/US2008/004637, Written Opinion mailed Jul. 30, 2008".

Van Der Goor, A. J, et al., "An OverView Of Deterministic functional RAM Chip Testing", *The Institution Of Electrical Engineers,Stevenage*, vol. 32,No. 1, (Mar. 1990), pp. 5-33.

* cited by examiner

FIG. 1 *(PRIOR ART)*

METHOD AND APPARATUS FOR TESTING THE FUNCTIONALITY OF A PAGE DECODER

FIELD OF THE INVENTION

The present invention relates generally to digital circuits, and more particularly to address decoders.

BACKGROUND OF THE INVENTION

Flash memory is a non-volatile computer memory that can be electrically erased and reprogrammed. FIG. 1 illustrates a conventional flash memory 100 organized into pages (e.g., pages 1-N). Each page (1-N) generally contains several words, and each word contains a pre-determined number of bits (e.g., 16 bits). Each word of a given page can be accessed with a pointer (or program counter) by means of an address decoder. As shown in FIG. 1, the address decoder is composed of a page decoder 102 and a word decoder 104. In particular, during a read from the flash memory 100, the page decoder 102 decodes the most significant bits of the program counter to determine which page to select, and the word decoder 104 decodes the least significant bits of the program counter to determine which word (within a selected page) is to be read. Each word has a group of bit lines (same size as the word size) that goes high when the corresponding word is selected. The word decoder 104 selects the correct bit lines that are used to multiplex the data onto an instructions bus (not shown). To write to the flash memory 100, page latches 106 are loaded with data. The least significant bits of the program counter are typically used to load the data to the correct portion of the page latches 106 in a similar fashion as in the word decoder (or the same word decoder can be used). Each page latch is connected to a corresponding bit line. During a read, the output from the page latches 106 is typically tri-stated to avoid drive contention.

Testing correct operation of a flash memory typically requires testing the functionality of both the word decoder and the page decoder. Testing the functionality of a word decoder is usually not an issue because it is generally sufficient to program—i.e., write values into—only one page and then read back the values programmed into the page. Testing the functionality of a page decoder, however, typically requires programming all pages within a flash memory. That is, a unique signature is written into each page of the flash memory, which unique signature is subsequently read from each page of the flash memory. This guarantees that the page decoder points to correct locations within the flash memory. Yet, programming each page of a flash memory is a very time-consuming process, and test time is an important factor in production flow. Another method for testing the functionality of a page decoder is to insert observation points (e.g., a scan chain) at the output of the page decoder. If the page decoder works properly, then only one line (used to access a page) is active at a time. Such a method, however, does not guarantee that the connection between the output lines and the pages is free of any faults.

BRIEF SUMMARY OF THE INVENTION

In general, in one aspect, this specification describes a method for testing correct operation of a page decoder in a memory comprised of N pages, in which each of the N pages has M memory cells. The method includes erasing the memory to reset all memory cells associated with each of the N pages in the memory; iteratively generating a unique bit sequence of M bits and programming the unique bit sequence into a plurality of the N pages at a given time until each of the N pages contains a unique bit sequence relative to other pages in the memory; and responsive to each of the N pages having a unique bit sequence, using the page decoder to read out each unique bit sequence associated with the N pages to verify correct operation of the page decoder.

Particular implementations can include one or more of the following features. Erasing the memory can include setting all memory cells associated with each of the N pages to a logic level of one. Programming the unique bit sequence into a plurality of the N pages can include setting one or more of the M memory cells of a given page to a logic level of zero. Programming the unique bit sequence into a plurality of the N pages at a given time can include programming the unique bit sequence into N/2 pages of the memory at a given time. In one aspect, only $\log_2 N$ iterations are required until each of the N pages contains a unique bit sequence relative to other pages in the memory. At least one of the plurality of N pages can be programmed with a given unique bit sequence during each iteration. The memory can be a flash memory.

In general, in another aspect, this specification describes a memory including N pages, in which each of the N pages has M memory cells. The memory further includes a page latch to iteratively load a unique bit sequence of M bits into a plurality of the N pages at a given time until each of the N pages contains a unique bit sequence relative to other pages in the memory, and a page decoder to read out each unique bit sequence associated with the N pages when each of the N pages has a unique bit sequence relative to other pages in the memory.

Implementations may provide one or more of the following advantages. In one aspect, a method and system for fully testing the functionality of a page decoder is provided that does not require use of observation points—e.g., a scan chain. In addition, in one implementation, the techniques described herein reduces the overall test time of a flash memory by reducing the number of programming operations required to place a unique signature into each page of the flash memory.

The details of one or more implementations are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF THE INVENTION

The present invention relates generally to digital circuits, and more particularly to address decoders. The following description is presented to enable one of ordinary skill in the art to make and use the invention and is provided in the context of a patent application and its requirements. The present invention is not intended to be limited to the implementations shown but is to be accorded the widest scope consistent with the principles and features described herein.

Figure 1:
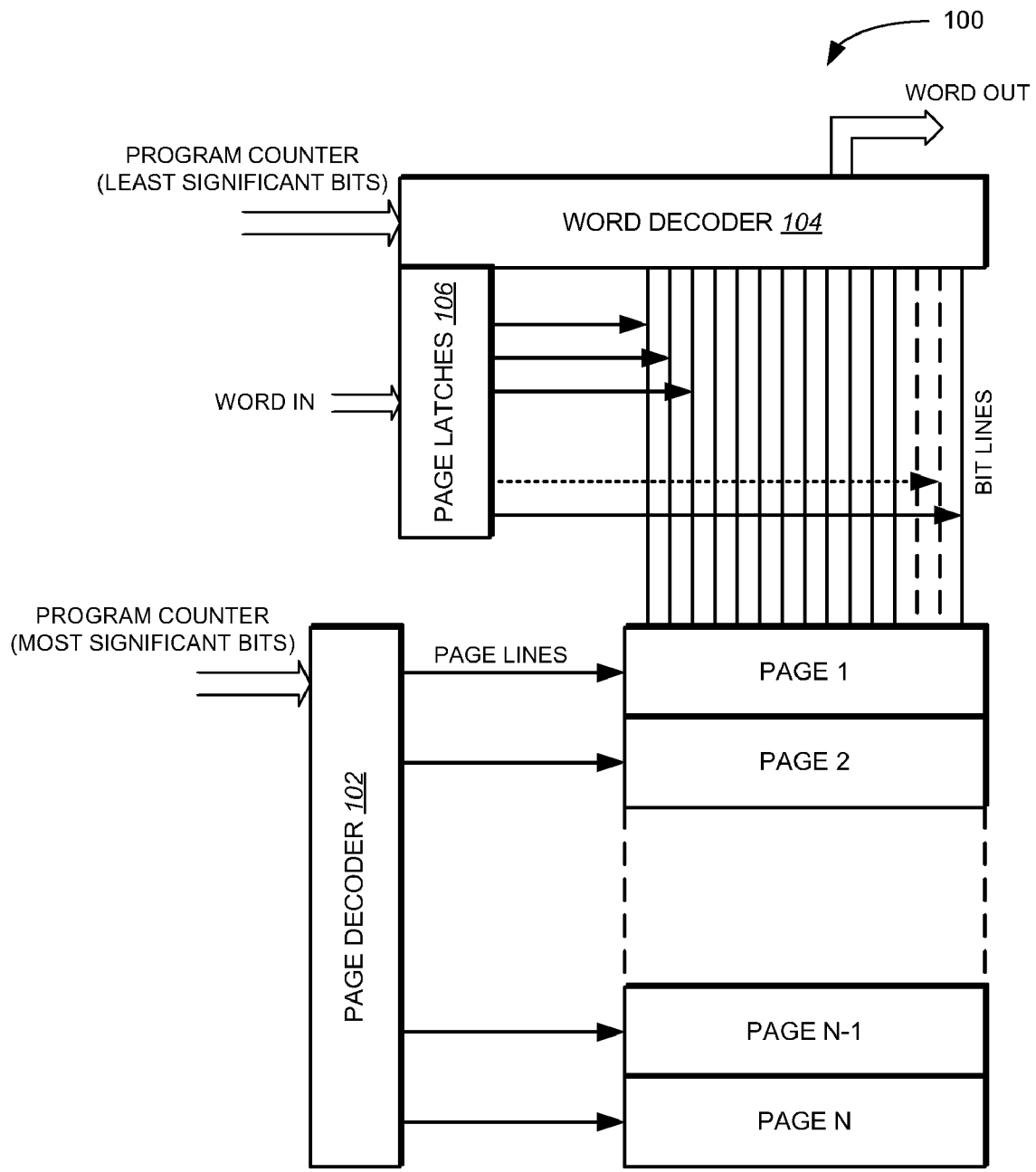
FIG. 1 is a block diagram of a conventional flash memory.
Figure 2:
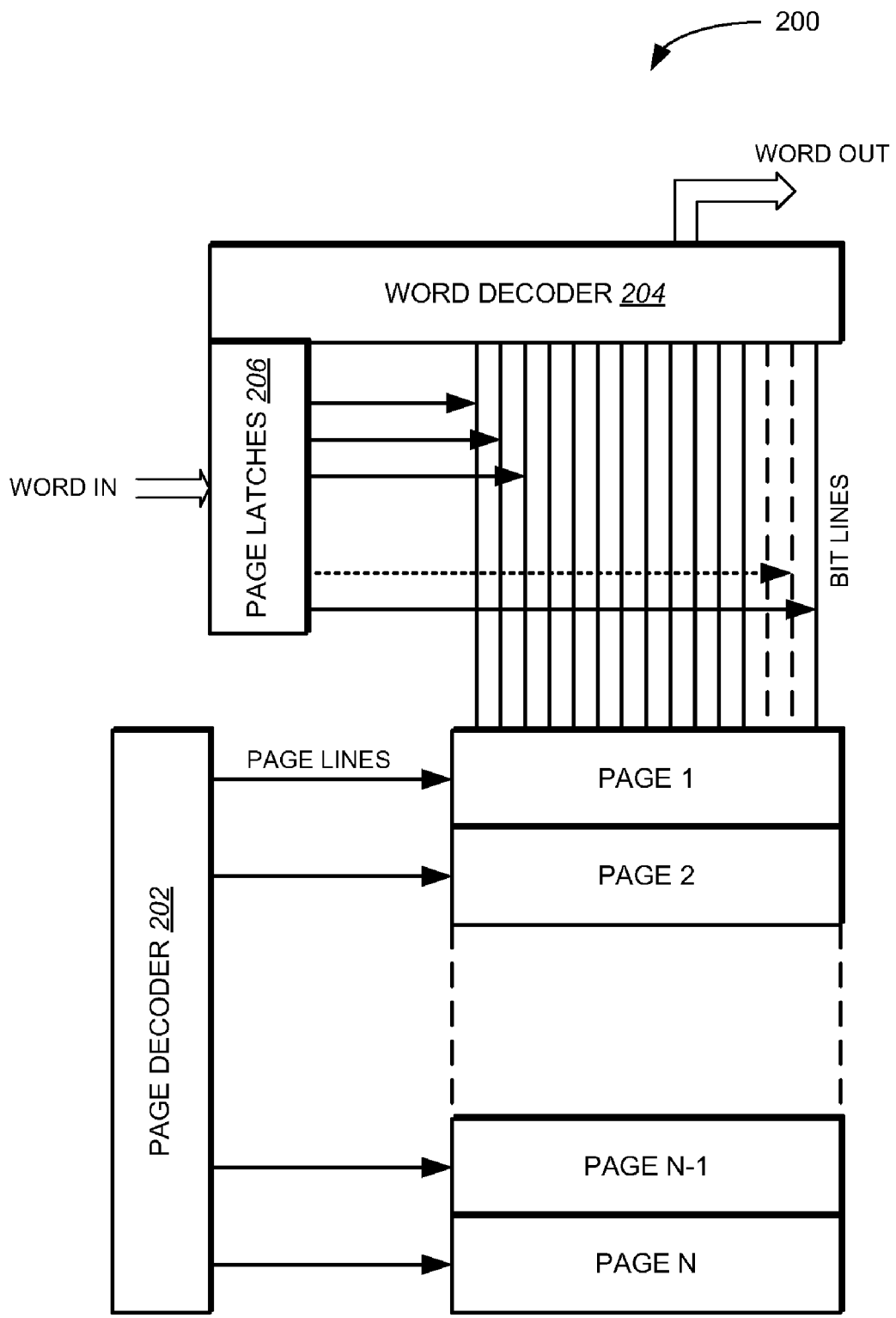
FIG. 2 is a block diagram of a flash memory in accordance with one implementation.

FIG. 2 illustrates a flash memory 200 in accordance with one implementation. In one implementation, the flash memory 200 is organized into pages (e.g., pages 1-N), and includes an address decoder (comprised of a page decoder 202 and a word decoder 204) for accessing each word of a given page within the flash memory 200. In one implementation, during a read from the flash memory 200, the page decoder 202 decodes the most significant bits of a program counter (not shown) to determine which page to select, and the word decoder 204 decodes the least significant bits of the program counter to determine which word (within a selected page) is to be read. In one implementation, to write to the flash memory 200, page latches 206 are loaded with data (or bit sequences) that are to be written to corresponding bit locations (or memory cells) within the flash memory 200—i.e., each page latch is connected to a corresponding bit line. The least significant bits of the program counter can be used to load the data to the correct portion of the page latches 206. In one implementation, each memory cell of the flash memory 200 is written to by setting a logic level of the memory cell to zero. Accordingly, in this implementation, erasing a memory cell requires setting the logic level of the memory cell to one. In one implementation, during a programming operation, an entire page is written to at once and the resulting logical value of the memory cells associated with the page depends upon what was previously loaded in the page latches 206. That is, a logic one in a page latch will leave the content (or logic level) of a corresponding memory cell in the flash memory untouched, whereas a logic zero in the page latch will write the corresponding memory cell in the flash memory (the logic level of the memory cell is set to zero).

As discussed above, testing correct operation of a flash memory typically requires testing the functionality of both the word decoder and the page decoder. Testing the functionality of a word decoder is usually not an issue because it is generally sufficient to program only one page and then read back the values programmed into the page. Testing the functionality of a page decoder, however, typically requires programming all pages (within a flash memory) with a unique signature that is subsequently read from each page of the flash memory. Unlike a conventional page decoder that requires N operations to program N pages of a flash memory, the page decoder 202 is operable to program a plurality of pages at a given time to reduce the amount of time required to program all the pages of a flash memory with a unique signature. Reducing the amount of time required to program pages of a flash memory reduces the overall time and cost required to test functionality of a flash memory. In one implementation, the number of operations required to program each of N pages of a flash memory (with a unique signature) is reduced to $\log_2 N$, as described in greater detail below.

Figure 3:
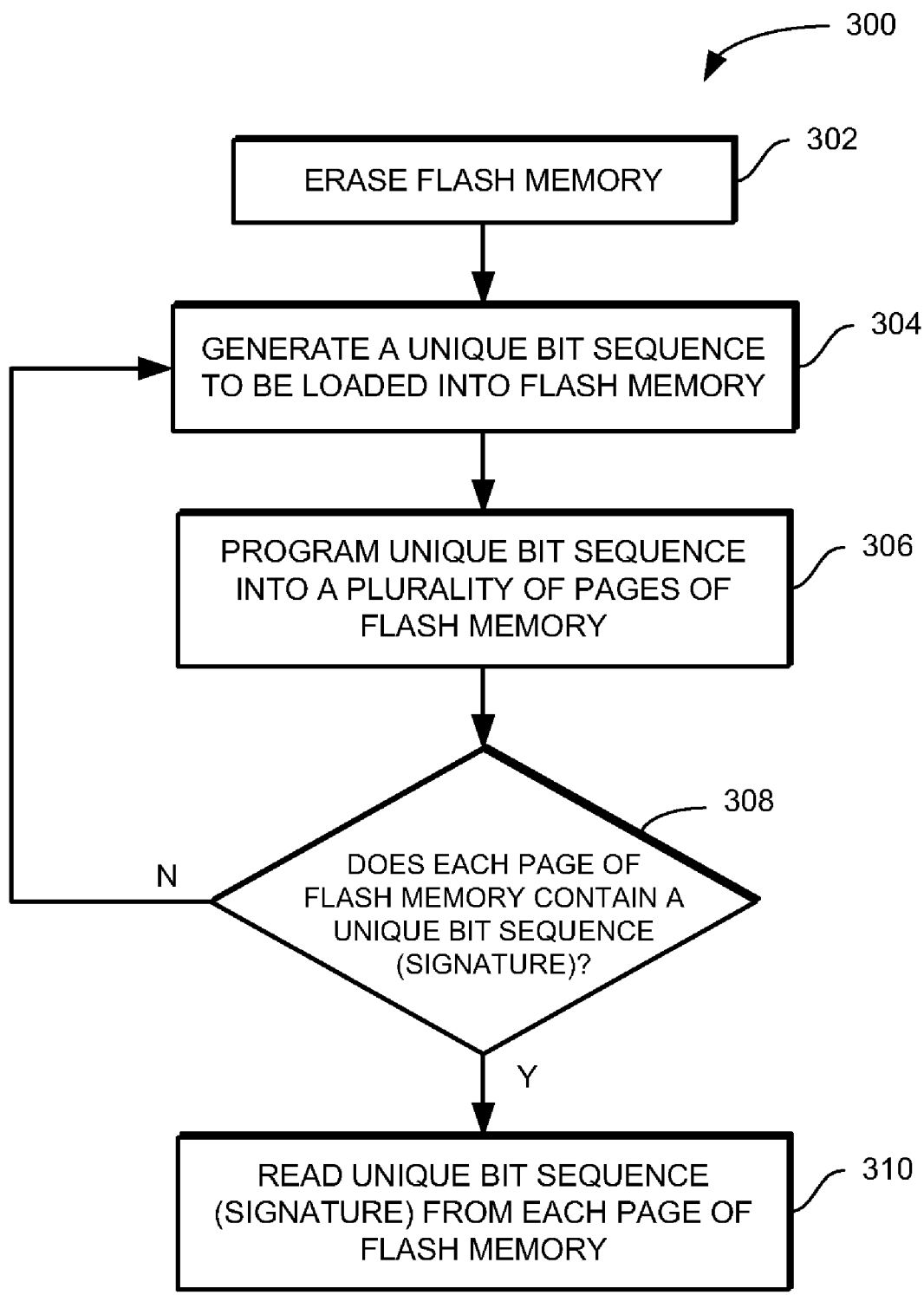
FIG. 3 is a method for testing the functionality of a page decoder of a flash memory in accordance with one implementation.

FIG. 3 illustrates a method 300 for testing the functionality of a page decoder (e.g., page decoder 202) of a flash memory in accordance with one implementation. A flash memory (e.g., flash memory 200) is erased (step 302). In one implementation, erasing a flash memory comprises setting a logic level of each memory cell (of the flash memory) to one. After the flash memory is erased, a unique bit sequence (or signature) to be loaded into the flash memory is generated (e.g., by logic) (step 304). In one implementation, the number of bits in the unique bit sequence is equal to the number of bits in a given page of the flash memory. For example, if a page contains 32 bits, then the unique bit sequence contains 32 bits. A bit sequence having such a length permits an entire page to be programmed at once. The unique bit sequence is programmed into a plurality of pages of the flash memory at one time (step 306). In one implementation, N/2 pages are programmed with the unique bit sequence, where N is the total number of pages within the flash memory.

A determination is made (e.g., by logic) whether each page of the flash memory contains a unique bit sequence (or unique signature) relative to other pages in the flash memory (step 308). If each page of the flash memory has not yet been programmed to have a unique signature, then the method 300 returns to step 304 to generate another unique bit sequence to be loaded into the flash memory. In one implementation, during each iteration, N/2 pages of the flash memory are programmed. Thus, in this implementation, only $\log_2 N$ iterations (or operations) are required to program each page of the flash memory with a unique signature. If, at step 306, a determination is made that each page of the flash memory has been programmed with a unique signature, then each unique signature is read from a corresponding page of the flash memory (step 310).

An example will now be provided. Table 1 below shows contents of a flash memory after the flash memory has been erased—i.e., each memory cell has a logic level of one. In the example, the flash memory has only 8 pages, and each page contains 5 bits.

TABLE 1

| Page 1 | 1 | 1 | 1 | 1 | 1 |
| Page 2 | 1 | 1 | 1 | 1 | 1 |
| Page 3 | 1 | 1 | 1 | 1 | 1 |
| Page 4 | 1 | 1 | 1 | 1 | 1 |
| Page 5 | 1 | 1 | 1 | 1 | 1 |
| Page 6 | 1 | 1 | 1 | 1 | 1 |
| Page 7 | 1 | 1 | 1 | 1 | 1 |
| Page 8 | 1 | 1 | 1 | 1 | 1 |

Table 2 below shows the contents of the flash memory after a first plurality of pages (e.g., N/2 pages) have been programmed with a unique signature. The unique signature programmed into the flash memory is [01111], and this signature is first loaded into the page latches prior to being written into the flash memory. The "H" means that the page lines corresponding to pages 1-4 are set high. Therefore, because only the first bit in the page latches is set to zero while all the other bits are set at one, only the first bit in each of the accessed pages (i.e., pages 1-4) are written while the other bits are left untouched.

TABLE 2

|   | Page latches | 0 | 1 | 1 | 1 | 1 |
|---|---|---|---|---|---|---|
| H | Page 1 | 0 | 1 | 1 | 1 | 1 |
| H | Page 2 | 0 | 1 | 1 | 1 | 1 |
| H | Page 3 | 0 | 1 | 1 | 1 | 1 |
| H | Page 4 | 0 | 1 | 1 | 1 | 1 |
|   | Page 5 | 1 | 1 | 1 | 1 | 1 |
|   | Page 6 | 1 | 1 | 1 | 1 | 1 |
|   | Page 7 | 1 | 1 | 1 | 1 | 1 |
|   | Page 8 | 1 | 1 | 1 | 1 | 1 |

In a second programming step, N/2 pages of the flash memory are access again at once. However, as shown in Table 3 below, the first two pages of the first half of the flash memory and the first two pages of the second half of the flash memory are accessed. And in this programming step, only the second bit in the page latches is set to zero. Table 3 shows the contents of the flash memory after the second programming step.

TABLE 3

|   | | Page latches | 1 | 0 | 1 | 1 | 1 |
|---|---|---|---|---|---|---|---|
| H | Page 1 | 0 | 0 | 1 | 1 | 1 |
| H | Page 2 | 0 | 0 | 1 | 1 | 1 |
|   | Page 3 | 0 | 1 | 1 | 1 | 1 |
|   | Page 4 | 0 | 1 | 1 | 1 | 1 |
| H | Page 5 | 1 | 0 | 1 | 1 | 1 |
| H | Page 6 | 1 | 0 | 1 | 1 | 1 |
|   | Page 7 | 1 | 1 | 1 | 1 | 1 |
|   | Page 8 | 1 | 1 | 1 | 1 | 1 |

In a third (and final) programming step, N/2 pages are again accessed at once, however, this time in an alternating fashion. In this programming step, only the third bit in the page latches is set to a logic level of zero. Table 4 shows the contents of the flash memory after the third programming step.

|   | | Page latches | 1 | 1 | 0 | 1 | 1 |
|---|---|---|---|---|---|---|---|
| H | Page 1 | 0 | 0 | 0 | 1 | 1 |
|   | Page 2 | 0 | 0 | 1 | 1 | 1 |
| H | Page 3 | 0 | 1 | 0 | 1 | 1 |
|   | Page 4 | 0 | 1 | 1 | 1 | 1 |
| H | Page 5 | 1 | 0 | 0 | 1 | 1 |
|   | Page 6 | 1 | 0 | 1 | 1 | 1 |
| H | Page 7 | 1 | 1 | 0 | 1 | 1 |
|   | Page 8 | 1 | 1 | 1 | 1 | 1 |

As shown in Table 4 above, the programming test sequence leaves a unique signature in each page with only $\log_2 N$ (or three) programming operations. These signatures can then be used to test the functionality of a page decoder through a read operation. As shown in the example above, page 1 is programmed with a given unique bit sequence during each programming step. In contrast, page 8 remains unchanged throughout all the programming steps.

Figure 4:
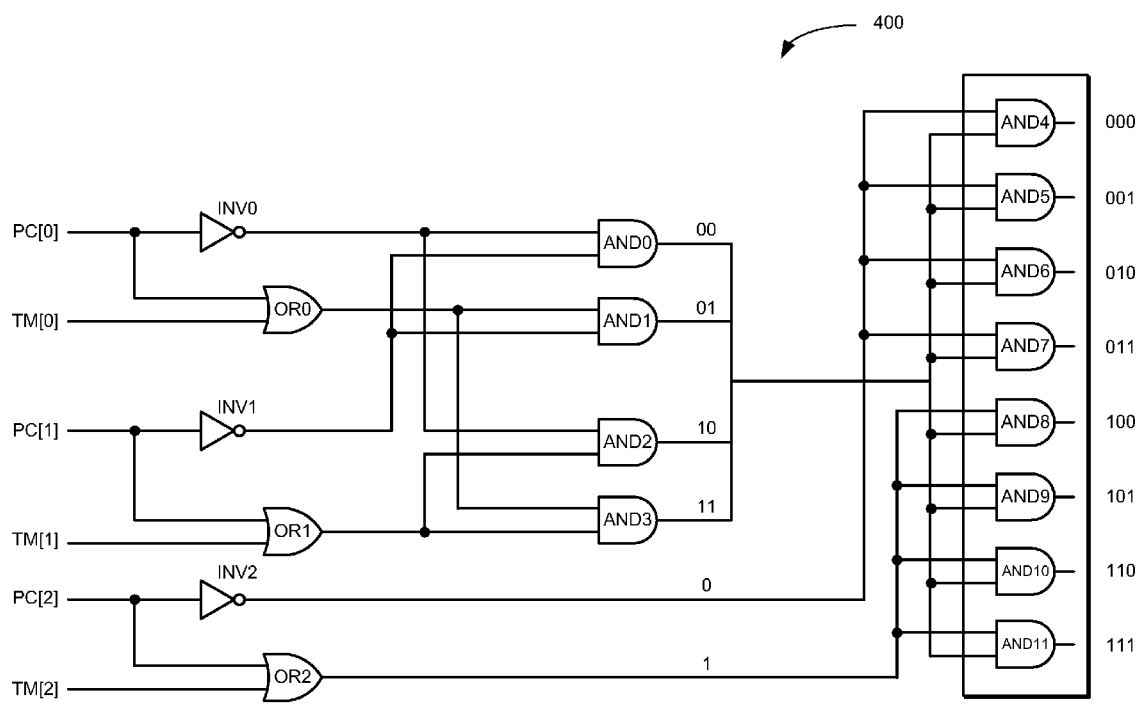
FIG. 4 is a schematic diagram of a page decoder in accordance with one implementation.

In general, to apply such a programming technique to a flash memory having N pages, one needs the highest $\log_2 N$ bits of the program counter. Each of these bits of the program counter can be combined with a test mode signal (also of size $\log_2 N$) to access N/2 pages of the flash memory at a time. FIG. 4 illustrates one implementation of a page decoder 400 operable to program N/2 pages of a flash memory at a time. The page decoder 400 includes inverters (INV0-INV2), OR gates (OR0-OR2), and AND gates (AND0-AND11). To access N/2 pages at a given time as set forth in the example above, the following programming constraints can be implemented:

Programming step 1:
    PC[2:0]=3'b000
    TM[2:0]=3'b011

Programming step 2:
    PC[2:0]=3'b000
    TM[2:0]=3'b101

Programming step 3:
    PC[2:0]=3'b000
    TM[2:0]=3'b110

Figure 5:
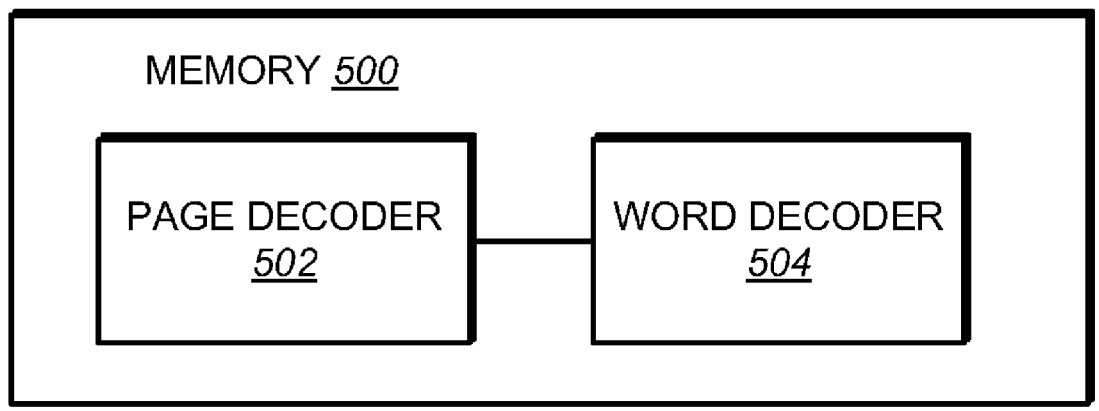
FIG. 5 is a block diagram of a memory including a page decoder in accordance with one implementation.

Various implementations of a page decoder for a flash memory have been described. Nevertheless, various modifications may be made to the implementations. For example, though examples of page decoder described above are generally described with respect to flash memories, a page decoder in accordance with the present invention can be implemented within other types of memories, as shown in FIG. 5. FIG. 5 illustrates a memory 500 including a page decoder 502 and a word decoder 504. The page decoder 502 is operable to program a plurality of pages (or memory blocks) (not shown) within the memory at a given time to reduce the amount of time required to program all the pages (or memory blocks) with a unique signature. The memory can be, for example, a RAM (random access memory), a ROM (read-only memory), a hybrid memory, in addition to a multi-level cell device (that can store more than 1 bit per memory cell). In addition, steps of the method discussed above can be performed in a different order and still achieve desirable results. Accordingly, many modifications may be made without departing from the scope of the following claims.

What is claimed is:

1. A method comprising:
   resetting memory cells of a plurality of pages of the memory;
   programming multiple pages of the plurality of pages at a time to change a value in at least one memory cell of each page of the multiple pages from a first value to a second value, wherein programming is performed until each page of the plurality of pages contains a unique bit sequence, wherein resetting the memory cells includes resetting the memory cells to the first value, and programming the multiple pages includes changing the value of only one memory cell of each page of the multiple pages from the first value to the second value; and
   reading the unique bit sequence of each page of the plurality of pages using a page decoder to verify operation of the page decoder.

2. The method of claim 1, wherein the first value includes a logic one value and the second value includes a logic zero value.

3. The method of claim 1, wherein programming the multiple pages includes programming one-half of the plurality of pages each time the programming is performed.

4. The method of claim 1, wherein programming is performed X times until each page of the plurality of pages contains the unique bit sequence such that $X=\log_2 N$, and wherein X and N are integers, and N is equal to a number of the plurality of pages.

5. The method of claim 1, wherein the memory device includes a flash memory device.

6. A memory device comprising:
   components configured to reset memory cells of a plurality of pages of the memory;
   components configured to program multiple pages of the plurality of pages at a time to change a value in at least one memory cell of each page of the multiple pages from a first value to a second value, wherein programming is performed until each page of the plurality of pages contains a unique bit sequence; and
   components configured to read the unique bit sequence of each page of the plurality of pages using a page decoder to verify operation of the page decoder, wherein the components configured to reset memory cells are operable to reset the memory cells to the first value, and the components configured to program the multiple pages are operable to change the value of only one memory cell of each page of the multiple pages from the first value to the second value.

7. The memory device of claim 6, wherein programming the multiple pages includes programming one-half of the plurality of pages each time the programming is performed.

8. The memory device of claim 6, wherein the components configured to program multiple pages are operable to perform only X times until each page of the plurality of pages contains the unique bit sequence such that $X=\log_2 N$, and wherein X and N are integers, and N is equal to a number of the plurality of pages.

9. A memory device comprising:
plurality of the pages, each page of the plurality of the pages including memory cells;
page latches to iteratively load multiple bits into multiple pages of the plurality of the pages at a time until each page of the plurality of the pages contains a unique bit sequence; and a page decoder to read out the unique bit sequence of each page of the plurality of the pages, wherein the page latches are operable to set first bit lines associated with first one-half pages of the plurality of the pages to a first value to change a value of memory cells coupled to the first bit lines, and the page latches are operable to set second bit lines associated with second one-half pages of the plurality of the pages to a second value to allow a value of memory cells coupled to the second bit lines to remain unchanged.

10. The memory device of claim 9, wherein the page latches are operable to iteratively load the multiple bits into one-half pages of multiple pages of the plurality of the pages at a time.

11. The memory device of claim 10, wherein the page latches are operable to iteratively load multiple bits into multiple pages of the plurality of the pages X times until each page of the plurality of the pages contains a unique bit sequence such that $X=\log_2 N$, and wherein X and N are integers, and N is equal to a number of the plurality of pages.

12. The memory device of claim 9, wherein the memory cells include flash memory cells.

* * * * *